United States Patent
Taniguchi et al.

(10) Patent No.: US 7,001,461 B2
(45) Date of Patent: Feb. 21, 2006

(54) CRYSTALLIZATION APPARATUS, CRYSTALLIZATION METHOD, AND PHASE SHIFTER

(75) Inventors: Yukio Taniguchi, Yokohama (JP); Masakiyo Matsumura, Yokohama (JP); Hirotaka Yamaguchi, Yokohama (JP); Mikihiko Nishitani, Yokohama (JP); Susumu Tsujikawa, Yokohama (JP); Yoshinobu Kimura, Yokohama (JP); Masayuki Jyumonji, Yokohama (JP)

(73) Assignee: Advanced LCD Technologies Development Center Co., Ltd., Yokohama (JP)

( * ) Notice: Subject to any disclaimer, the term of this patent is extended or adjusted under 35 U.S.C. 154(b) by 98 days.

(21) Appl. No.: 10/656,202

(22) Filed: Sep. 8, 2003

(65) Prior Publication Data

US 2004/0058484 A1 Mar. 25, 2004

(30) Foreign Application Priority Data

Sep. 9, 2002 (JP) .............................. 2002-262249

(51) Int. Cl.
*C30B 5/00* (2006.01)
*G03F 1/00* (2006.01)
*H01L 21/20* (2006.01)

(52) U.S. Cl. .......................... 117/200; 117/7; 438/166; 438/487; 430/5

(58) Field of Classification Search ................ 438/166, 438/487; 117/7, 200; 430/5
See application file for complete search history.

(56) References Cited

U.S. PATENT DOCUMENTS 6,180,444 B1 * 1/2001 Gates et al. ................ 438/237
6,686,287 B1 * 2/2004 Dohi .......................... 438/706
6,746,942 B1 * 6/2004 Sato et al. .................. 438/586
6,812,072 B1 * 11/2004 Jang et al. .................. 438/149

FOREIGN PATENT DOCUMENTS

JP 6-289431 10/1994
JP 2000-82669 3/2000

OTHER PUBLICATIONS

M. Matsumura, Applied Surface Science, vol. 21, No. 5, pp. 278-287, "Preparation of Ultra-Large Grain Silicon Thin-Films by Excimer-Laser", 2000 (with partial English translation).

C.-H. Oh, et al., Applied Surface Science 154-155, pp. 105-111, "Optimization of Phase-Modulated Excimer-Laser Annealing Method for Growing Highly-Packed Large-Grains in Si Thin-Films", 2000.

(Continued)

*Primary Examiner*—Alexander Ghyka
(74) *Attorney, Agent, or Firm*—Oblon, Spivak, McClelland, Maier & Neustadt, P.C.

(57) ABSTRACT

A crystallization apparatus includes an illumination system which applies illumination light for crystallization to a non-single-crystal semiconductor film, and a phase shifter which includes first and second regions disposed to form a straight boundary and transmitting the illumination light from the illumination system by a first phase retardation therebetween, and phase-modulates the illumination light to provide a light intensity distribution having an inverse peak pattern that light intensity falls in a zone of the non-single-crystal semiconductor film containing an axis corresponding to the boundary. The phase shifter further includes a small region which extends into at least one of the first and second regions from the boundary and transmits the illumination light by a second phase retardation with respect to the at least one of the first and second regions.

11 Claims, 9 Drawing Sheets

OTHER PUBLICATIONS

M. Matsumura, Physica Status Solidi (a), vol. 166, No. 2, pp. 715-728, "Application of Excimer-Laser Annealing to Amorphous, Poly-Crystal and Single-Crystal Silicon Thin-Film Transistors", 1998.

M. Matsumura, et al., Thin Solid Films, vol. 337, pp. 123-128, "Advanced Excimer-Laser Annealing Process for Quasi Single-Crystal Silicon Thin-Film Devices", 1999.

C.-H. Oh, et al., Japanese Journal of Applied Physics, vol. 37, No. 10, pp. 5474-5479, "Preparation of Position-Controlled Crystal-Silicon Island Arrays by Means of Excimer-Laser Annealing", 1998.

K. Inoue, et al., The Transactions of the Institute of Electronics, Information and Communication Engineers C, vol. J85-C, No. 8, pp. 624-629, "Amplitude and Phase Modulated Excimer-Laser Melt-Regrowth Method of Silicon Thin-Films- a New Growth Method of 2-D Position-Controlled Large-Grains", 2002 (with parthial English translation).

* cited by examiner

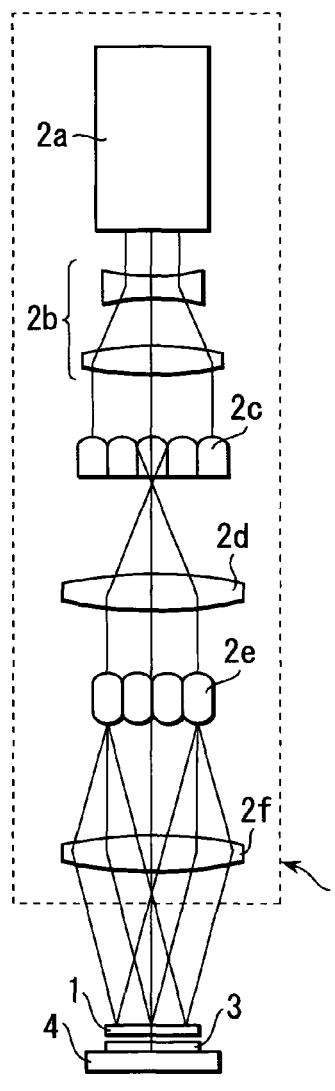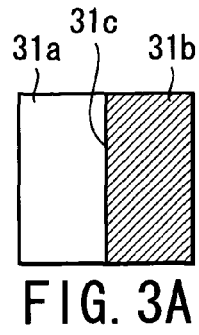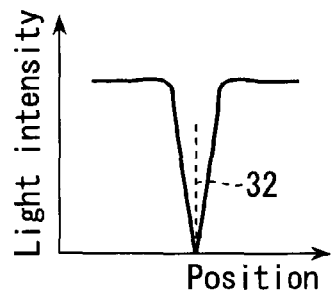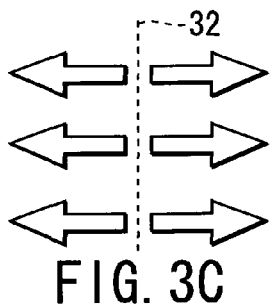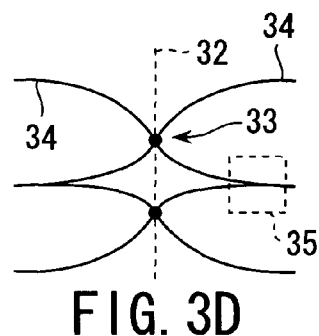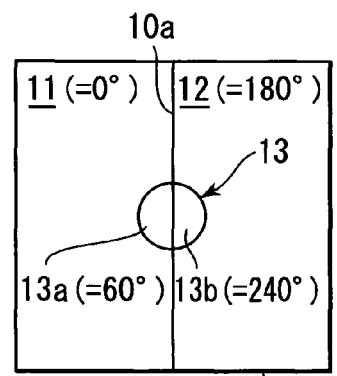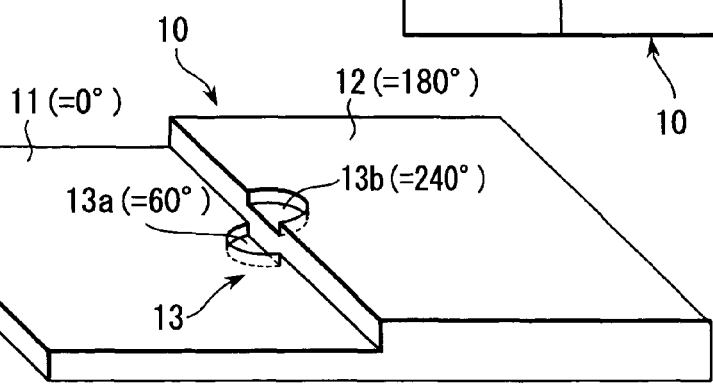

CRYSTALLIZATION APPARATUS, CRYSTALLIZATION METHOD, AND PHASE SHIFTER

CROSS-REFERENCE TO RELATED APPLICATIONS

This application is based upon and claims the benefit of priority from the prior Japanese Patent Application No. 2002-262249, filed Sep. 9, 2002, the entire contents of which are incorporated herein by reference.

BACKGROUND OF THE INVENTION

1. Field of the Invention

The present invention generally relates to a crystallization apparatus, crystallization method, and phase shifter applied to a non-single-crystal semiconductor film such as a polycrystalline or amorphous semiconductor film, particularly to a crystallization apparatus, crystallization method, and phase shifter for modulating a phase of laser light to be applied to the non-single-crystal semiconductor film in the crystallization.

2. Description of the Related Art

Materials of thin film transistors (TFT) for use as switching devices for controlling voltages to be applied to pixels, for example, of a liquid crystal display (LCD) have heretofore been roughly divided into amorphous silicon and poly-silicon.

The mobility of the poly-silicon is higher than that of the amorphous silicon. Therefore, when the poly-silicon is used to form thin film transistors, a switching speed increases and the display responds more quickly as compared with the use of the amorphous silicon. Such thin film transistors are also usable as components of peripheral LSI circuits. Furthermore, there is an advantage that design margins of other components can be reduced. When peripheral circuits such as a driver circuit and DAC are integrated on the display, these peripheral circuits are operable at a higher speed.

Although the poly-silicon includes a number of crystal grains, the mobility thereof is lower than that of single-crystal silicon. When the poly-silicon is used to form a small-sized transistor, this raises a problem that the number of crystal grain boundaries fluctuates within a channel region. In recent years, crystallization methods for producing single-crystal silicon grains of a large diameter have been proposed in order to improve the mobility and reduce the fluctuation in the number of crystal grain boundaries within the channel region.

For this type of crystallization method, "phase-modulated Excimer Laser Annealing (ELA)" has heretofore been known that applies excimer laser light to a non-single-crystal semiconductor film via a phase shifter (phase-shift mask) disposed in parallel with and in the proximity of the semiconductor film to produce a crystallized semiconductor film. Details of the phase-modulated ELA are disclosed, for example, in "Applied Surface Science Vol. 21, No. 5, pp. 278 to 287, 2000".

In the phase-modulated ELA, the light intensity distribution of the light applied to the non-single-crystal semiconductor film is controlled in a zone corresponding to a phase-shift section of the phase shifter to have an inverse peak pattern (that is, a pattern in which the light intensity significantly increases according to an increase in the distance from the center of the zone). As a result, a temperature gradient is generated in the semiconductor film of a molten state according to the light intensity distribution, and a crystal nucleus is created at a part of the semiconductor film which first coagulates according to the light intensity of substantially 0. Then, a crystal grows in a lateral direction toward the outside from the crystal nucleus (lateral growth), thereby forming a single-crystal grain of a large diameter.

Conventionally, the phase shifter for general use is a so-called linear phase shifter, which includes pairs of rectangular regions having a phase retardation $\pi$ (180 degrees) therebetween and repeatedly arranged in one direction. In this case, a straight boundary between two regions serves as the phase-shift section, and therefore the light intensity on the non-single-crystal semiconductor film is controlled to have an inverse peak pattern in which the light intensity is substantially 0 at a location of an axis corresponding to the phase-shift section and one-dimensionally increases according to an increase in the distance from the location.

In the conventional art in which the aforementioned linear phase shifter is used, a temperature distribution is lowest on an axis corresponding to the phase-shift section, and a temperature gradient is generated in a direction perpendicular to the axis corresponding to the phase-shift section. That is, the crystal nucleus is created on the axis corresponding to the phase-shift section, and crystallization proceeds from the crystal nucleus in the direction perpendicular to the axis corresponding to the phase-shift section. As a result, the crystal nucleus is created on the axis corresponding to the phase-shift section, but a position on the axis where the crystal nucleus is created is indefinite. In other words, in the conventional art, it has been impossible to specify the creation point of the crystal nucleus, and it has also been impossible to two-dimensionally control a region where the crystal grain is formed.

BRIEF SUMMARY OF THE INVENTION

An object of the present invention is to provide a crystallization apparatus, crystallization method, and phase shifter, which can two-dimensionally control a region where a single-crystal grain is formed.

According to a first aspect of the present invention, there is provided a crystallization apparatus comprising: an illumination system which applies illumination light for crystallization to a non-single-crystal semiconductor film; a phase shifter which includes first and second regions disposed to form a straight boundary and transmitting the illumination light from the illumination system by a first phase retardation therebetween, and phase-modulates the illumination light to provide a light intensity distribution having an inverse peak pattern that light intensity falls in a zone of the non-single-crystal semiconductor film containing an axis corresponding to the boundary; the phase shifter further including a small region which extends into at least one of the first and second regions from the boundary and transmits the illumination light from the illumination system by a second phase retardation with respect to the at least one of the first and second regions.

According to a second aspect of the present invention, there is provided a crystallization method comprising: applying illumination light for crystallization to a non-single-crystal semiconductor film; phase-modulating the illumination light by using a phase shifter which includes first and second regions disposed to form a straight boundary and transmitting the illumination light by a first phase retardation therebetween, to provide a light intensity distribution having an inverse peak pattern that light intensity falls in a zone of the non-single-crystal semiconductor film containing an axis corresponding to the boundary; and transmitting the illumination light through a small region, which is formed in the phase shifter to extend into at least one of the first and second region from the boundary, by a second phase retardation with respect to the at least one of the first and second regions.

According to a third aspect of the present invention, there is provided a phase shifter comprising: first and second regions disposed to form a straight boundary and transmitting illumination light by a first phase retardation therebetween, and a small region which extends into at least one of the first and second regions from the boundary and transmits the illumination light by a second phase retardation with respect to the at least one of the first and second regions.

In these crystallization apparatus, crystallization method, and phase shifter, a crystal nucleus is created at a position limited by the small region of the phase sifter, and crystallization proceeds from the crystal nucleus in a growth direction limited one-dimensionally. Thus, the position of a crystal grain boundary is substantially controllable. That is, it is possible to two-dimensionally control a region where a single-crystal grain is formed, by specifying the positions of the crystal nucleus and the crystal grain boundary.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a diagram schematically showing the configuration of a crystallization apparatus according to a first embodiment of the present invention;

FIGS. 2A and 2B are plan and perspective views schematically showing the configuration of a basic segment in a phase shifter shown in FIG. 1;

FIGS. 3A to 3D are diagrams for explaining the function of a linear phase shifter;

DETAILED DESCRIPTION OF THE INVENTION

Figure 4A:
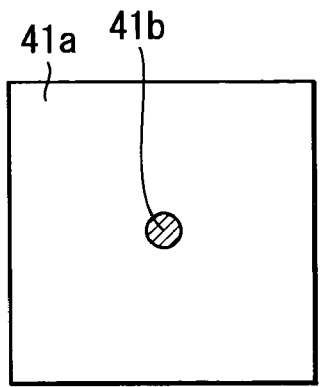
FIGS. 4A to 4D are diagrams for explaining the function of a circular phase shifter.

A crystallization apparatus according to a first embodiment of the present invention will be described hereinafter with reference to the accompanying drawings.

FIG. 1 is a diagram schematically showing the configuration of the crystallization apparatus. The crystallization apparatus includes an illumination system 2 which illuminates a phase shifter 1. The illumination system 2 includes a KrF excimer laser source 2a which supplies a laser light having a wavelength, for example, of 248 nm. It is to be noted that the light source 2a may be replaced by another appropriate light source such as an XeCl excimer laser source. The laser light from the light source 2a is enlarged via a beam expander 2b and subsequently incident upon a first fly eye lens 2c.

The first fly eye lens 2c has a focal surface provided on the rear side thereof and serves as a plurality of light sources. Luminous fluxes from these light sources illuminate an incidence surface of a second fly eye lens 2e via a first condenser optical system 2d in an overlapped manner. The second fly eye lens 2e has a focal surface provided on the rear side thereof and serves as light sources more than those in the focal surface of the first fly eye lens 2c. Luminous fluxes from the light sources in the focal surface of the second fly eye lens 2e illuminate the phase shifter 1 via a second condenser optical system 2f in an overlapped manner.

The first fly eye lens 2c and first condenser optical system 2d constitute a first homogenizer, and an incidence angle on the phase shifter 1 is homogenized by the first homogenizer. The second fly eye lens 2e and second condenser optical system 2f constitute a second homogenizer, and an in-plane position on the phase shifter 1 is homogenized by the second homogenizer. Thus, a light having a substantially homogenous light intensity distribution is applied from the illumination system 2 to the phase shifter 1.

The phase shifter 1 is disposed in parallel with and the proximity with a sample substrate 3 for crystallization, and phase-modulates the laser light to be applied from the illumination system 2 to the sample substrate 3. The sample substrate 3 is obtained, for example, by forming amorphous silicon film on an underlying film covering a glass plate for a liquid crystal display by a chemical vapor growth method. The phase shifter 1 is disposed to face the amorphous semiconductor film. The sample substrate 3 is placed at a predetermined position on a substrate stage 4 and held by a vacuum or electrostatic chuck.

FIGS. 2A and 2B are plan and perspective views schematically showing the configuration of a basic segment in the phase shifter 1 used in the first embodiment. Referring to FIGS. 2A and 2B, a basic segment 10 of the phase shifter 1 includes first and second regions 11 and 12 of a rectangular shape formed on both sides of a straight boundary 10a, and a small region 13 of a circular shape formed to extend into the first and second regions 11 and 12. The small region 13 includes a first small sector 13a which is a semicircular region formed in the first region 11, and a second small sector 13b which is a semicircular region formed in the second region 12.

The first region 11 and the second region 12 are configured to transmit light by a first phase retardation of 180 degrees therebetween. The first and second small sectors 13a and 13b are configured to transmit light by a second phase retardation of 60 degrees with respect to the first and second regions 11 and 12. Further, a phase retardation of 180 degrees is given between the lights transmitted through the first and second small sectors 13a and 13b.

Concretely, when the phase shifter 1 is formed, for example, of quartz glass having a refractive index of 1.5 with respect to a light having a wavelength of 248 nm, a step of 248 nm is provided between the first and second regions 11 and 12. The first small sector 13a is formed as a concave to provide a step of about 82.7 nm between the first region 11 and first small sector 13a. The second small sector 13b is formed as a concave to provide a step of about 82.7 nm between the second region 12 and second small sector 13b. A step of 248 nm is provided between the first small sector 13a and second small sector 13b. Moreover, the small region 13 also serves as the phase-shift section as described later. In addition, the phase shifter 1 includes a plurality of basic segments 10 arrayed two-dimensionally.

In the first embodiment, the phase shifter 1 has a phase-shift pattern formed as a combination of the above-described linear and circular phase shifters in a surface facing the sample substrate 3. The functions of linear and circular phase shifters will be described prior to the function of the phase shifter 1 provided in the first embodiment.

FIGS. 3A to 3D are diagrams for explaining the function of the linear phase shifter. If the linear phase shifter is applied to the first embodiment, as shown in FIG. 3A, the phase shifter includes two regions 31a and 31b having a phase retardation of 180 degrees therebetween, for example. A straight boundary 31c between two regions 31a and 31b serves as the phase-shift section. This provides a light intensity distribution on the sample substrate 3, as shown in FIG. 3B. The light intensity distribution has an inverse peak pattern in which the light intensity is substantially 0 on an axis 32 corresponding to the phase-shift section (straight boundary) and one-dimensionally increases toward the outside in a direction perpendicular to the axis 32.

In this case, as shown in FIG. 3C, a temperature distribution is lowest along the axis 32 corresponding to the phase-shift section, and a temperature gradient (shown by arrows in the figure) is generated in the direction perpendicular to the axis 32 corresponding to the phase-shift section.

That is, as shown in FIG. 3D, crystal nuclei 33 are created on the axis 32 corresponding to the phase-shift section, and crystallization proceeds from the crystal nuclei 33 in the direction perpendicular to the axis 32 corresponding to the phase-shift section.

In FIG. 3D, curves 34 indicate crystal grain boundaries. Crystal grains are formed in regions defined by the crystal grain boundaries 34. The crystal nuclei 33 are created on the axis 32 corresponding to the phase-shift section, but a position on the axis 32 where the crystal nuclei are created is indefinite. In other words, when the linear phase shifter is applied to the first embodiment, it is impossible to specify the position where the crystal nucleus is created. Thus, it is also impossible to two-dimensionally control a region where the crystal grain is formed. More specifically, it is impossible to control the region occupied by the crystal grain to include a region 35 reserved for forming a channel of a TFT.

Figure 4B:
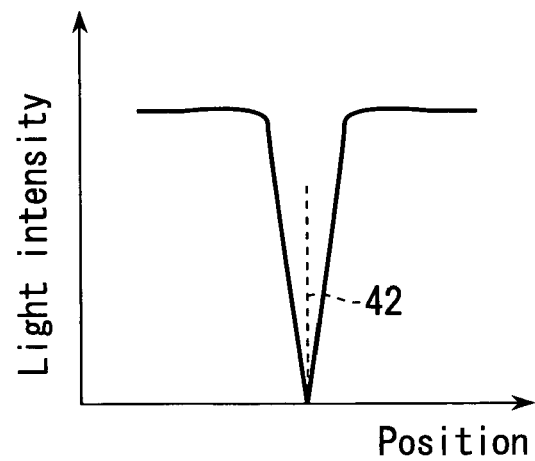

FIGS. 4A to 4D are diagrams for explaining the function of the circular phase shifter. If the circular phase shifter is applied to the first embodiment, as shown in FIG. 4A, the circular phase shifter includes a rectangular region 41a and a circular small region 41b having a phase retardation of 60 degrees (or 180 degrees) by which the phase leads with respect to the rectangular region 41a, for example. The circular small region 41b serves as the phase-shift section. Therefore, on the sample substrate 3, as shown in FIG. 4B, the light intensity distribution of the inverse peak pattern is obtained in which the light intensity is substantially 0 on a small part 42 corresponding to the phase-shift section and the light intensity increases toward the outside radially from the small part 42.

Figure 4C:
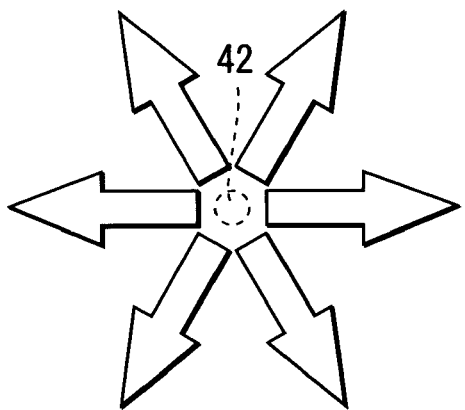
Figure 4D:
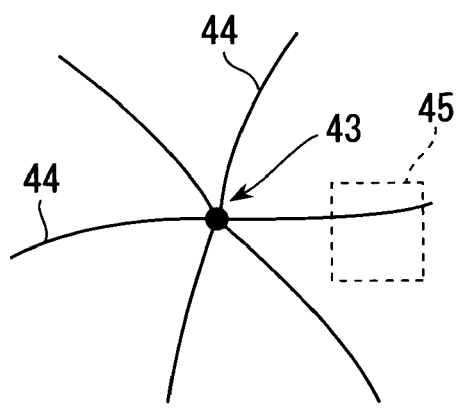

In this case, as shown in FIG. 4C, the temperature distribution is lowest in the small part 42 corresponding to the phase-shift section, and the temperature gradient (shown by arrows in the figure) is radially generated toward the outside from the small part 42 corresponding to the phase-shift section. That is, as shown in FIG. 4D, a plurality of crystal nuclei 43 (only one crystal nucleus is shown for clarification of drawing in FIG. 4D) are created in or around the small part 42 corresponding to the phase-shift section, and the crystallization radially proceeds toward the outside from the plurality of crystal nuclei 43.

When the circular phase shifter is applied to the first embodiment in this manner, the plurality of crystal nuclei 43 are created in or around the small part 42 corresponding to the phase-shift section, and it is therefore possible to control the positions where the crystal nuclei 43 are to be created. However, since the crystal grains grow from the crystal nuclei 43 radially and simultaneously, positions where crystal grain boundaries 44 are formed are indefinite, and it is impossible to two-dimensionally control the regions where the crystal grains are formed. Concretely, it is impossible to control the region occupied by the crystal grain to include a region 45 reserved for forming a channel of a TFT.

The first embodiment uses a defocus method in which the phase shifter is disposed substantially in parallel with and in the proximity of the sample substrate. If the defocus method is also applied to the circular phase shifter, the light intensity in the small part 42 corresponding to the phase-shift section can be smallest by providing a phase retardation of about 60 degrees between the rectangular region 41a and circular small region 41b. On the other hand, a second embodiment described later uses a projection NA method. If the projection NA method is applied to the circular phase shifter, the light intensity in the small part 42 corresponding to the phase-shift section can be smallest by providing a phase retardation of about 180 degrees between the rectangular region 41a and circular small region 41b.

It is to be noted that for further detailed configurations or functions of the linear and circular phase shifters, "Optimization of phase-modulated excimer-laser annealing method for growing highly-packed large-grains in Si thin-films", Applied Surface Science 154 to 155 (2000) 105 to 111 can be referred to.

Figure 5A:
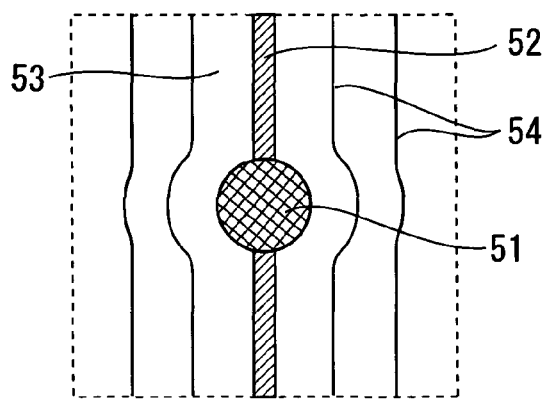
FIGS. 5A to 5C are diagrams for briefly explaining the function of the phase shifter shown in FIGS. 2A and 2B.
Figure 5B:
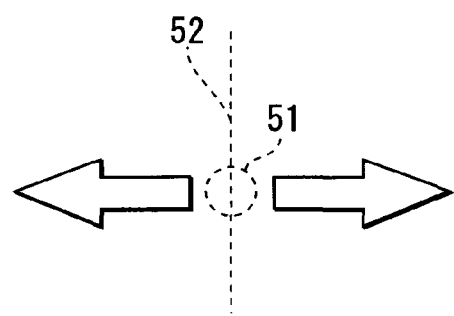
Figure 5C:
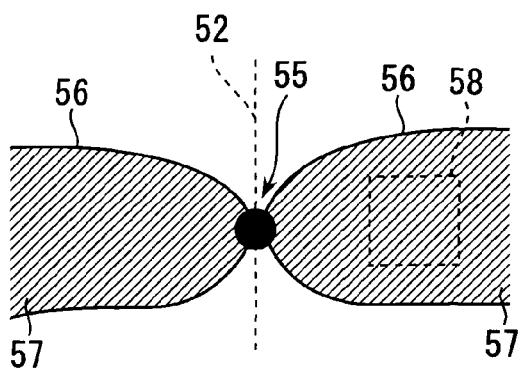
Figure 6:
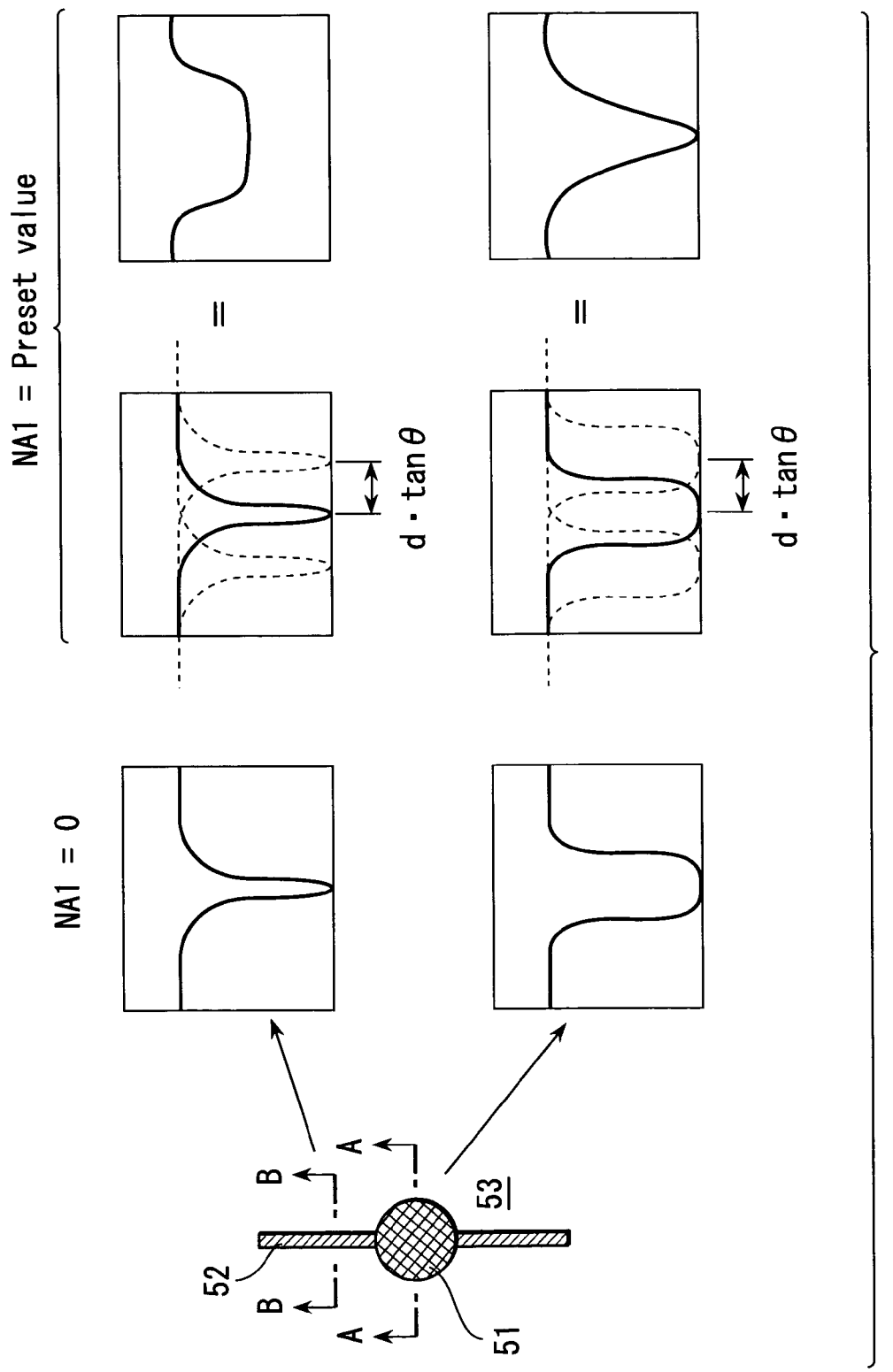
FIG. 6 is a diagram for explaining the function of the phase shifter shown in FIGS. 2A and 2B in further detail.

FIGS. 5A to 5C are diagrams for briefly explaining the function of the phase shifter 1 of the first embodiment. FIG. 6 is a diagram for explaining the function of the phase shifter 1 in further detail. As described above, the phase shifter 1 of the first embodiment has a phase-shift pattern obtained by combining the linear phase-shift pattern with the circular phase-shift pattern. Therefore, on the sample substrate 3, as shown in FIG. 5A, the light intensity is substantially 0 and smallest in a circular part 51 corresponding to the circular small region 13 which serves as the phase-shift section in the phase shifter 1.

Moreover, a straight part 52 corresponding to the boundary 10a of the phase shifter 1 has the next smallest light intensity to the circular part 51. On the other hand, in a peripheral part 53 other than the circular part 51 and straight part 52, as schematically shown by contour lines 54 indicating an equal light intensity, the light intensity increases toward the outside in the direction perpendicular to the straight part 52. With reference to FIG. 6, description will be made in detail about the feature that the light intensity in the circular part 51 is lower than that in the straight part 52 and the light intensity increases toward the outside in the direction perpendicular to the straight part 52.

Referring to FIG. 6, the line A—A crosses the circular part 51 in a direction perpendicular to the straight part 52, and the line B—B crosses the straight part 52 in the direction perpendicular to the straight part 52. When the illumination light incident upon the phase shifter 1 is a parallel luminous flux (that is, the numerical aperture NA1 for the illumination light=0), a light intensity distribution along the line A—A is obtained in a manner that the light intensity is substantially 0 in the circular part 51 and substantially constant in the peripheral part 53a, and a light intensity distribution along the line B—B is obtained in a manner that the light intensity is substantially 0 in the straight part 52 and significantly increases toward the peripheral part 53 to reach a constant value.

On the other hand, when the numerical aperture NA1 for the illumination light incident upon the phase shifter 1 is at a preset value substantially larger than 0, the light intensity distributions along the lines A—A and B—B are influenced by a blur amount d·tan θ, where d is a distance between the sample substrate 3 and the phase shifter 1, and θ is a maximum incidence angle of the illumination light to the phase shifter 1. As a result, the light intensity distribution along the line A—A has an inverse peak pattern in which the light intensity is substantially 0 in the center of the circular part 51 and significantly increases toward the peripheral part 53 to substantially reach the constant value.

Further, the light intensity distribution along line B—B has a U-shaped pattern that the light intensity indicates a substantially constant value remarkably greater than 0 in a wider part extended from the straight part 52 by the blur amount d·tan θ and indicates, in peripheral part 53 outer than the wider part, another substantially constant value greater than that in the wider part. Generally, when the numerical aperture NA1 for the illumination light is enlarged (that is, maximum incidence angle θ of the illumination light is enlarged), the blur amount d·tan θ influencing the light intensity distribution increases. Therefore, the light intensity in the straight part 52 increases.

However, when the blur amount d·tan θ is within a preset range, that is, when the numerical aperture NA1 for the illumination light is within the preset range, the light intensity in the circular part 51 maintains a value of substantially 0. In view of the above, the numerical aperture NA1 of the preset value is provided for the illumination light to be applied to the phase shifter 1 in the first embodiment. Thus, the light intensity distribution obtained on the sample substrate 3 has an inverse peak pattern that the light intensity is substantially 0 in the circular part 51, higher in the straight part 52 than in the circular part 51, and significantly increases toward the outside from the circular part 51 in the direction perpendicular to the straight part 52.

The width of the inverse peak pattern changes in proportion to ½ square of a distance between the phase shifter 1 and sample substrate 3 (i.e., defocus amount). In this case, the temperature is lowest in the circular part 51, and the temperature gradient indicated by the arrow in FIG. 5B is generated in the direction perpendicular to the straight part 52. Thus, as shown in FIG. 5C, a crystal nucleus 55 is created in or in the vicinity of the circular part 51 corresponding to the phase-shift section, and crystallization proceeds from the crystal nucleus 55 in the direction perpendicular to the straight part 52.

As a result, the creation point of the crystal nucleus 55 is limited to the circular part 51 or the vicinity. Moreover, the growth direction of the crystal grain from the crystal nucleus 55 is one-dimensionally limited to a direction perpendicular to the straight part 52. Thus, the position of the crystal grain boundary 56 is substantially controllable. That is, it is possible to two-dimensionally control a region where a single-crystal grain 57 is formed, by specifying the positions of the crystal nucleus 55 and the crystal grain boundary 56. More specifically, it is impossible to control the region occupied by the crystal grain 57 to include a region 58 reserved for forming a channel of a TFT.

In the first embodiment, the light intensity distribution along the line A—A transversely crossing the circular part 51 corresponding to the phase-shift section is actually obtained by simulation following a specific numeric value examples. In the numeric value examples, the small region 13 has a regular octagonal shape inscribed with a circle having a radius of 1 µm, the distance d between the sample substrate 3 and phase shifter 1 is 8 µm, and a wavelength λ of the illumination light is 248 nm. Moreover, the numerical aperture NA1 for the illumination light is set to NA1=1 and NA1=0.1 in the examples.

Figure 7A:
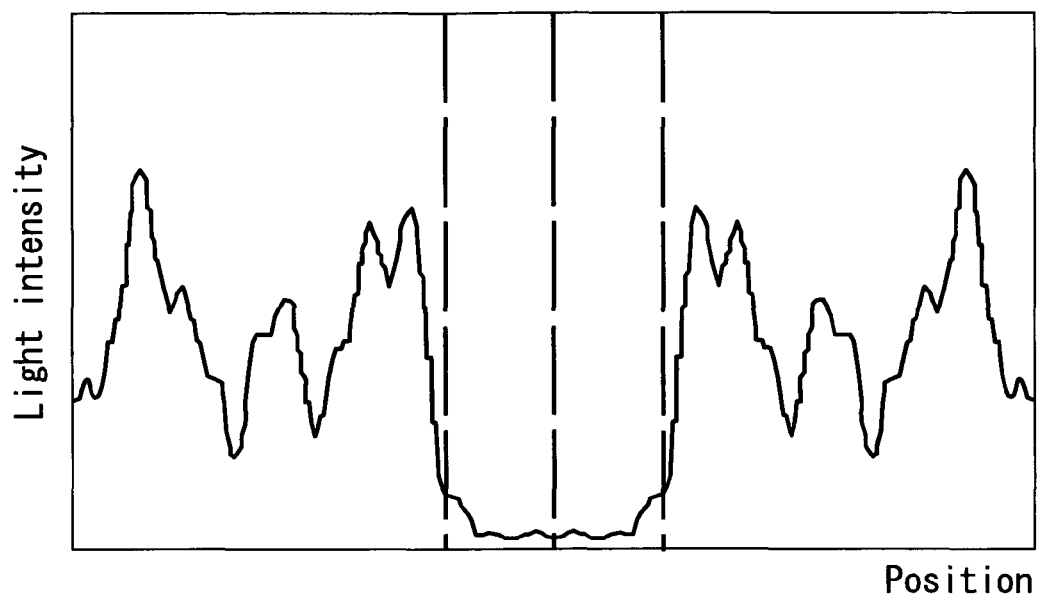
FIGS. 7A and 7B are graphs showing a light intensity distribution obtained along a line A—A crossing a circular part corresponding to the phase-shift section in numeric value examples in which the numerical aperture NA1 for an illumination light is set to NA1=0 and NA1=0.1.
Figure 7B:
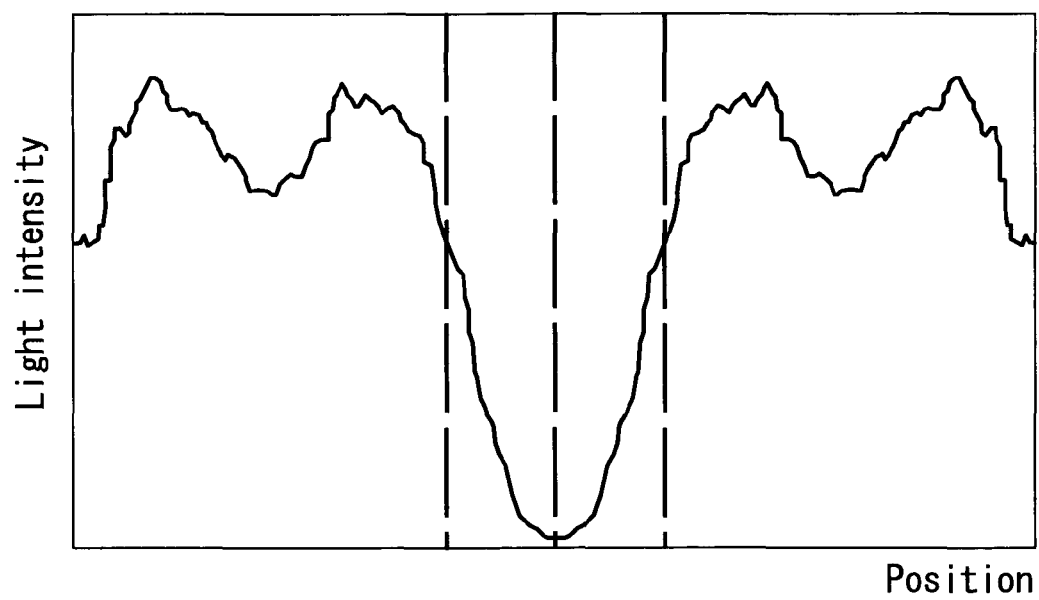

FIGS. 7A and 7B are diagrams showing the light intensity distribution obtained along the line A—A transversely crossing the circular region 51 corresponding to the phase-shift section in the numeric value examples in which the numerical aperture NA1 for the illumination light is set to NA1=0 and NA1=0.1. From the simulation results shown in FIGS. 7A and 7B, it is confirmed that a light intensity distribution substantially identical to that along the line A—A schematically shown in FIG. 6 is obtainable in any of the cases where the numerical aperture NA1 for the illumination light is set to NA1=0 and NA1=0.1.

In this manner, in the first embodiment, sufficient lateral growth of a crystal grain from the crystal nucleus 55 is realized, and the crystal grain can have a large diameter in the crystallized semiconductor film. Particularly, the mobility of the large crystal grain is high in the direction of the lateral growth. Therefore, a transistor having satisfactory characteristics can be produced in the crystal grain if the source-drain path thereof is set in the direction of the lateral growth.

It is to be noted that in the first embodiment the following condition equation (1) is preferably satisfied:

$$a \geq d \cdot \tan \theta \qquad (1),$$

where θ is the maximum incidence angle of the illumination light incident upon the phase shifter 1, and d is the distance (gap) between the sample substrate 3 (a non-single-crystal semiconductor film such as polycrystalline or amorphous semiconductor film) and the phase shifter 1. Moreover, a is a dimension of the first small sector 13a or the second small sector 13b in the direction perpendicular to the boundary 10a, and is equivalent to the radius of the small region 13 in the first embodiment.

As described above, the right side of the condition equation (1) represents the blur amount generated when the illumination light incident upon the phase shifter 1 is not the parallel luminous flux. Therefore, when the condition equation (1) is satisfied, it is possible to secure that the light intensity on the sample substrate 3 is substantially 0 in the part 51 corresponding to the circular small region 13 serving as the phase-shift section. In other words, when the condition equation (1) is not satisfied, the lowest value of the light intensity is substantially greater than 0 in the part 51 on the sample substrate 3, and the desired light intensity distribution of the inverse peak pattern cannot be obtained.

Figure 8:
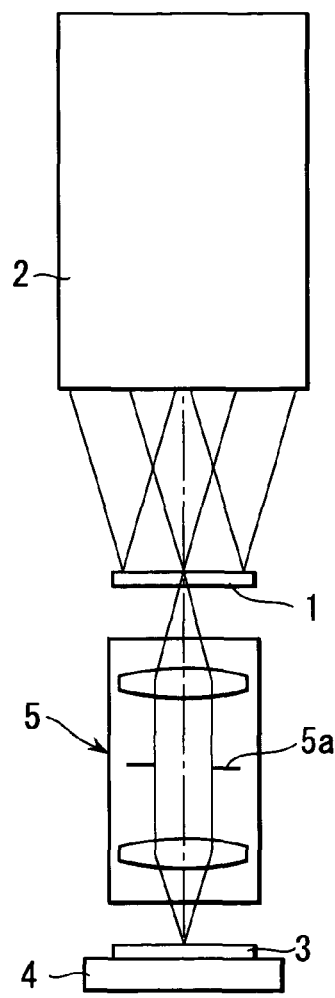
FIG. 8 is a diagram schematically showing the configuration of the crystallization apparatus according to a second embodiment of the present invention.
Figure 9:
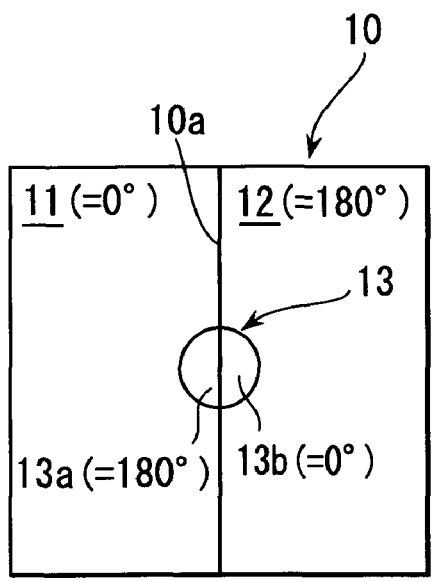
FIG. 9 is a plan view for schematically showing the configuration of a basic segment in the phase shifter shown in FIG. 8.

FIG. 8 is a diagram schematically showing the configuration of the crystallization apparatus according to a second embodiment of the present invention. FIG. 9 is a plan view for schematically showing the configuration of the basic segment 10 of the phase shifter 1 in the second embodiment. The second embodiment is similar to the first embodiment in the configuration, but is basically different from the first embodiment in that the sample substrate 3 and the phase shifter 1 are located at positions optically conjugated with respect to an optical imaging system 5. The second embodiment will be described so as to clarify the difference. In FIG. 8, the internal configuration of the illumination system 2 is omitted for simplification.

In the second embodiment, the optical imaging system 5 is disposed between the phase shifter 1 and sample substrate 3 to locate the phase shifter 1 and sample substrate 3 at the optically conjugated positions. In other words, the sample substrate 3 is set in a plane optically conjugated with the phase shifter 1 (image plane of the optical imaging system 5). An aperture diaphragm unit 5a is disposed in an iris plane of the optical imaging system 5. The aperture diaphragm unit 5a includes a plurality of aperture diaphragms different from one another in the size of the aperture (light transmission portion), and these aperture diaphragms can be changed with respect to an optical path.

Moreover, the aperture diaphragm unit 5a may also be formed of an iris diaphragm that can continuously change the size of the aperture. In any case, the size of the aperture of the aperture diaphragm unit 5a (numerical aperture NA on the imaging side of the optical imaging system 5) is set to obtain a required light intensity distribution of the inverse peak pattern on the semiconductor film of the sample substrate 3. In addition, the optical imaging system 5 may be a refractive optical system, reflective optical system, or a refractive and reflective optical system.

Referring to FIG. 9, the phase shifter 1 of the second embodiment includes basically the same configuration as that of the phase shifter 1 of the first embodiment. That is, the shifter includes the first region 11, second region 12, and small region 13, and the phase retardation of 180 degrees is given as the first phase retardation between the transmitted lights of the first region 11 and second region 12. However, in the second embodiment, different from the first embodiment, the phase retardation of 180 degrees is given as the second phase retardation between the transmitted lights of the first region 11 and first small sector 13a and between the transmitted lights of the second region 12 and second small sector 13b.

Concretely, for example, when the phase shifter 1 is formed of quartz glass having a refractive index of 1.5 with respect to the light having a wavelength of 248 nm, a step of 248 nm is disposed between the first and second regions 11 and 12. The step of 248 nm is also disposed between the first region 11 and first small sector 13a and between the second region 12 and second small sector 13b. The step of 248 nm is also disposed between the first small sector 13a and second small sector 13b. Moreover, the second embodiment is similar to the first embodiment in that the small region 13 serves as the phase-shift section and that the phase shifter 1 includes a plurality of basic segments 10 arrayed two-dimensionally.

In the second embodiment, the width of the inverse peak pattern obtained on the semiconductor film of the sample substrate 3 by means of the phase shifter 1 is of the same degree as that of a resolution R of the optical imaging system 5. Assuming that the wavelength of the light for use is $\lambda$ and the numerical aperture of the optical imaging system 5 on the imaging side is NA, the resolution R of the optical imaging system 5 is defined by R=k$\lambda$/NA, where a constant k indicates a value substantially close to 1 depending on specifications of the illumination system 2 for illuminating the phase shifter 1, degree of coherence of the luminous flux supplied from the light source 2a, and definition of the resolution. In this manner, in the second embodiment, when the image-side numerical aperture NA of the optical imaging system 5 is reduced, and the resolution of the optical imaging system 5 is lowered, the width of the inverse peak pattern increases.

Also in the second embodiment, in the same manner as in the first embodiment, the creation point of the crystal nucleus is limited to a part corresponding to the phase-shift section of the phase shifter 1, and the growth direction of the crystal grain from the crystal nucleus is one-dimensionally limited. Thus, the position of the crystal grain boundary is substantially controllable. That is, it is possible to two-dimensionally control a region where a single-crystal grain is formed, by specifying the positions of the crystal nucleus and the crystal grain boundary.

It is to be noted that in the first embodiment the phase shifter 1 is contaminated by abrasion in the sample substrate 3, and further satisfactory crystallization is sometimes inhibited. On the other hand, in the second embodiment, the optical imaging system 5 is located between the phase shifter 1 and sample substrate 3, and a relatively large gap is secured between the sample substrate 3 and optical imaging system 5. Therefore, the satisfactory crystallization can be realized without being influenced by the abrasion in the sample substrate 3.

Moreover, in the first embodiment, since the phase shifter 1 and sample substrate 3 should be spaced by a very small distance (e.g., several micrometers to several hundreds of micrometers), it is difficult to guide a detection light for detecting the alignment position into a narrow optical path between the phase shifter 1 and sample substrate 3, and it is also difficult to adjust the distance between the phase shifter 1 and sample substrate 3. On the other hand, since a relatively large distance is secured between the sample substrate 3 and optical imaging system 5 in the second embodiment, it is easy to guide the detection light for detecting the alignment position into the optical path and to adjust the alignment between the sample substrate 3 and optical imaging system 5.

It is to be noted that in the second embodiment the following condition equation (2) is preferably satisfied.

$$a \leq \lambda/NA \tag{2}$$

where NA denotes the numerical aperture of the optical imaging system 5 on the imaging side, λ is the wavelength of the light, and a denotes the dimension of the first small sector 13a or the second small sector 13b in the direction perpendicular to the boundary 10a.

As described above, the right side of the condition equation (2) represents the resolution of the optical imaging system 5. Therefore, when the condition equation (2) is satisfied, the dimension of the first small sector 13a or the second small sector 13b is not more than the resolution. On the sample substrate 3, an area whose light intensity is substantially 0 does not have a hollow annular shape, but a solid circular shape within the part 51 corresponding to the circular small region 13 serving as the phase-shift section. In other words, when the condition equation (2) is not satisfied, the area whose light intensity is substantially 0 has the annular shape in the part 51 of the sample substrate 3, and the light intensity distribution having a desired peak pattern cannot be obtained.

Concretely, when the numerical aperture NA of the optical imaging system 5 on the imaging side is excessively large, two inverse peak patterns are provided in parallel as the light intensity distribution. Thus, the light intensity distribution having a desired peak pattern cannot be obtained. On the other hand, when the image-side numerical aperture NA of the optical imaging system 5 is excessively small, the light intensity distribution having a desired inverse peak pattern cannot be obtained since the lowest light intensity increases from a value of substantially 0.

In the above-described embodiments, the phase retardation of 180 degrees is given as the first phase retardation between the transmitted lights of the first region 11 and second region 12 in the phase shifter 1. In this case, not only the lowest light intensity can be obtained in the straight part 52 corresponding to the boundary 10a of the phase shifter 1, but also the light intensity distribution can be symmetrical with respect to the straight part 52. However, for example, when it is intended that the crystallization proceeds toward one side of the straight part 52, the phase retardation substantially different from 180 degrees may also be given between the transmitted lights of the first region 11 and second region 12.

Moreover, in each of the embodiment described above, the small region 13 is formed in the phase shifter 1 to have a circular shape extending into both the first region 11 and second region 12 and symmetrical with respect to the boundary 10a. However, the shape of the small region 13 is arbitrary. This is apparent from the simulation in which a regular octagonal shape is applied to the small region 13. For example, when it is intended that the crystallization proceeds toward one side of the straight part 52, a shape projecting toward a corresponding side of the boundary 10a. That is, in general, the small region serving as the phase-shift section may be formed to extend from the boundary 10a into at least one of the first and second regions 11 and 12.

Furthermore, as described above, the second phase retardation given between the first region 11 and first small sector 13a and between the second region 12 and second small sector 13b is preferably about 60 degrees in the defocus method of the first embodiment, and about 180 degrees in the projection NA method in the second embodiment. When the second phase retardation is set in this manner, the light intensity in the part 51 on the sample substrate 3 corresponding to the small region 13 serving as the phase-shift section can be controlled substantially to 0.

Figure 10A:
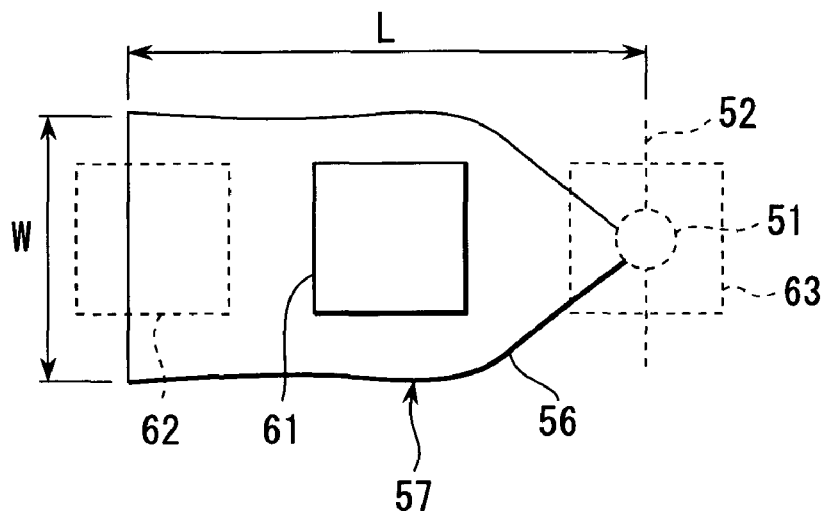
FIGS. 10A and 10B are diagrams showing the alignment between a crystal grain and a channel formed in each embodiment in comparison with that of a related art.
Figure 10B:
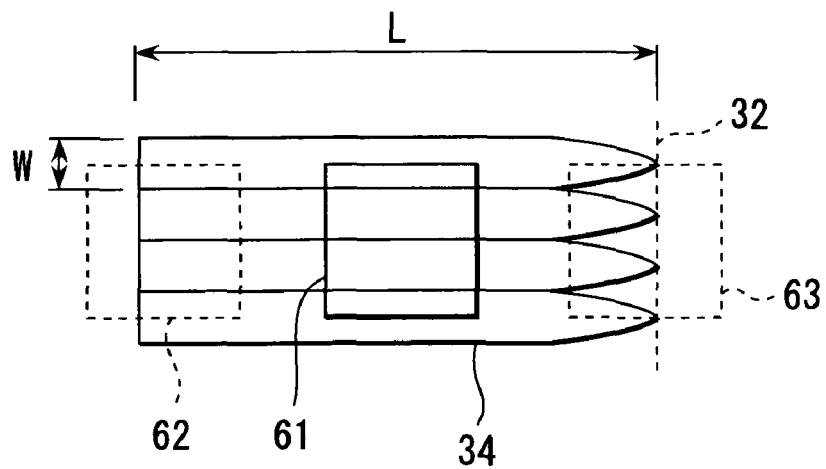

FIGS. 10A and 10B are diagrams showing the alignment between a crystal grain and a channel formed in each embodiment in comparison with that of a related art. Referring to FIG. 10B, in the related art using the linear phase shifter, the crystal grains collide with one another when growing from the respective crystal nuclei created at random. Therefore, only very thin and long crystal grains are formed in the direction perpendicular to the axis 32 corresponding to the phase-shift section (boundary) of the linear phase shifter. Therefore, in the related art, a plurality of crystal grains are used to form a channel 61 of a thin film transistor.

On the other hand, in each embodiment, since the crystal nuclei are separately created in or in the vicinity of the circular parts 51 corresponding to the circular small regions 13 serving as the phase-shift section in the phase shifter 1, the crystal grains do not collide with one another when growing from the crystal nuclei. Therefore, for the crystal grain 57 obtained using the crystallization apparatus and method of each embodiment, as shown in FIG. 10A, a size W of the crystal grain 57 in a direction parallel to the straight part 52 corresponding to the boundary 10a of the phase shifter 1 is relatively large as compared with a size L of the crystal grain 57 in the direction perpendicular to the straight part 52.

As a result, the channel 61 for the thin film transistor can be formed in the single crystal (crystal grain) 57 formed using the crystallization apparatus and method of each embodiment. In this case, in the phase shifter 1 for use in the crystallization apparatus and method of each embodiment, the phase-shift pattern including the first region 11, second region 12, and small region 13 needs to be formed in the area reserved for the channel 61 of the thin film transistor.

Moreover, a source 62 and drain 63 are formed on the sides of the channel 61 in the direction perpendicular to the straight part 52 corresponding to the boundary 10a of the phase shifter 1. In addition, the size W of the crystal grain 57 is preferably ⅓ or more of the size L, and the size W of the crystal grain 57 is preferably 1 μm or more. By this configuration, it is possible to securely form the channel 61 in the single crystal 57.

Figure 11A:
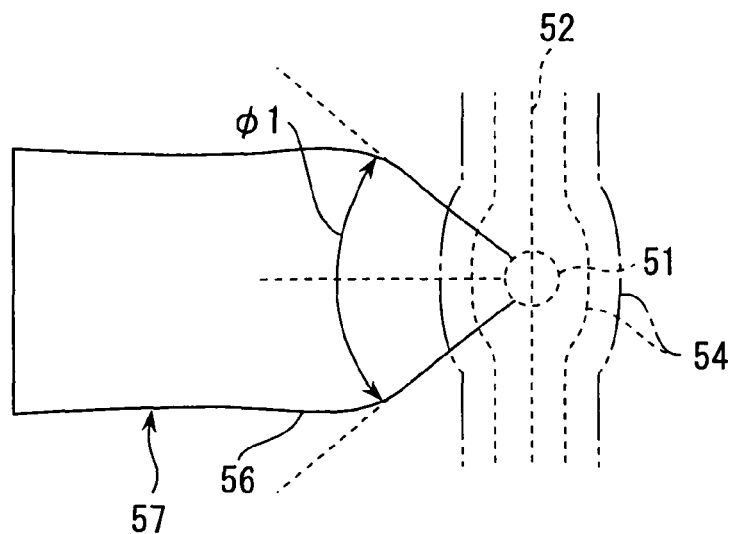
FIGS. 11A and 11B are diagrams showing a growth angle estimated from the start point of crystal growth of the crystal grain formed in each embodiment in comparison with that of the related art.
Figure 11B:
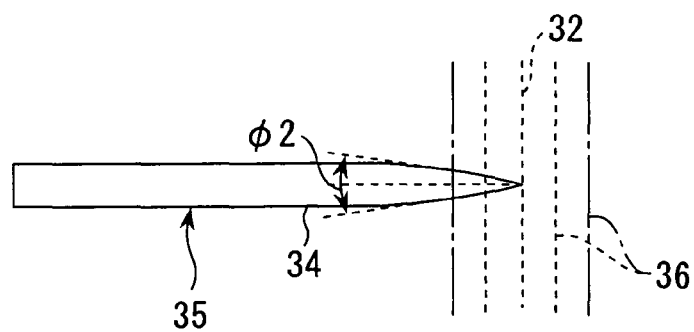

FIGS. 11A and 11B are diagrams showing a growth angle estimated from the start point of crystal growth of the crystal grain formed in each embodiment in comparison with that of the related art. Referring to FIG. 11B, in the related art using the linear phase shifter, as shown by contour lines 36 having an equal light intensity, the gradient of the light intensity distribution (also the gradient of the temperature distribution) is straight. Therefore, a crystal grain 35 grows only in one direction, and an angle φ2 of the crystal grain 35 estimated from the start point of the crystal growth is very small.

On the other hand, in each embodiment, as shown by the contour lines 54 having the equal light intensity, the gradient of the light intensity distribution (the gradient of the temperature distribution) has a curved shape around the circular part 51. Therefore, the crystal grain 57 two-dimensionally grows, and an angle φ1 of the crystal grain 57 estimated from the start point of the crystal growth is very large as compared with the related art. As a result, the channel 61 (not shown in FIGS. 11A and 11B) is easily formed in the single crystal (crystal grain) 57. Additionally, a distance between the start point of the crystal growth and the channel 61 is minimized and miniaturization can be achieved. For this purpose, the angle φ1 of the crystal grain 57 estimated from the start point of the crystal growth is preferably wholly 60 degrees or more.

In each above-described embodiment, the light intensity distribution can be calculated even in a stage of design, but it is preferable to observe and confirm the light intensity distribution on the sample surface (exposure surface). For this, an image of the sample surface may be enlarged by the optical system and inputted via image capture devices such as CCD. When the light for use is an ultraviolet ray, the optical system is restricted. Therefore, a fluorescent plate may be disposed in the sample surface to change the light to a visible light.

Figure 12A:
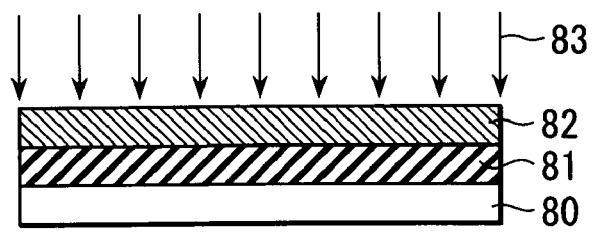
FIGS. 12A to 12E are sectional views showing steps of producing an electronic device using the crystallization apparatus of each embodiment.

FIGS. 12A to 12E are sectional views showing steps of producing an electronic device using the crystallization apparatus of each embodiment. As shown in FIG. 12A, on an insulating substrate 80 (e.g., alkali glass, quartz glass, plastic, polyimide, and the like), an underlying film 81 (e.g., a laminate film of SiN having a film thickness of 50 nm and $SiO_2$ having a film thickness of 100 nm) and an amorphous semiconductor film 82 (e.g., Si, Ge, SiGe having a film thickness of about 50 nm to 200 nm) are formed using a chemical vapor growth method or sputter method, so that the sample substrate 3 is prepared. Subsequently, the crystallization apparatus of each embodiment is used to irradiate a part or all of the surface of the amorphous semiconductor film 82 with laser light 83 (e.g., KrF excimer laser light, XeCl excimer laser light, and the like).

Figure 12B:
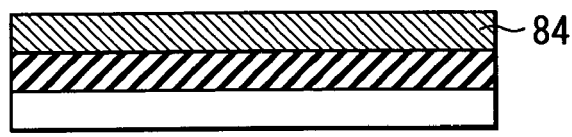
Figure 12C:
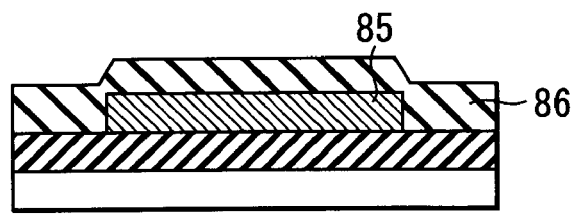
Figure 12D:
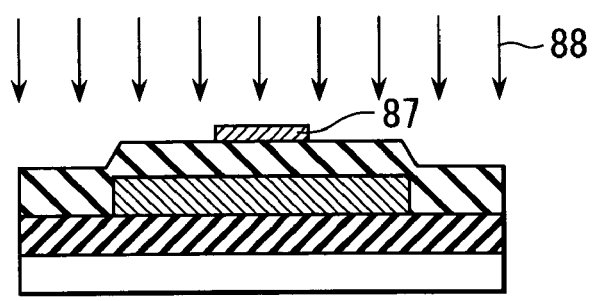

In this manner, as shown in FIG. 12B, a polycrystalline or single-crystal semiconductor film 84 including the crystal grain having a large diameter is produced. Next, as shown in FIG. 12C, a photolithography technique is used to process the polycrystalline or single-crystal semiconductor film 84 into an island-shaped semiconductor film 85, and an $SiO_2$ film having a film thickness of 20 nm to 100 nm is formed as a gate insulating film 86 using the chemical vapor growth method or sputter method. Furthermore, as shown in FIG. 12D, a gate electrode 87 (e.g., silicide, MoW, and the like) is formed. The gate electrode 87 is used as a mask to implant impurity ions 88 (phosphor for an N channel transistor, boron for a P channel transistor). Thereafter, an anneal process (e.g., at 450° C. for one hour) is performed in a nitrogen atmosphere to activate impurities.

Figure 13:
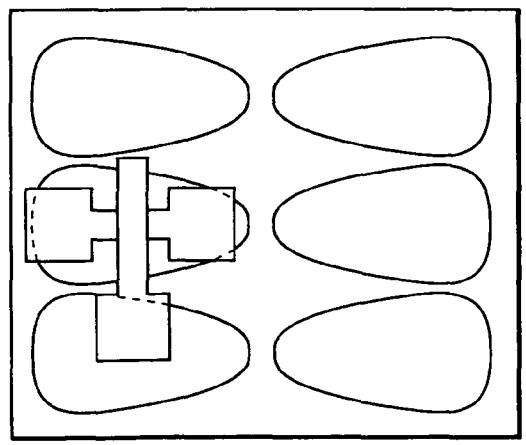
FIG. 13 is a plan view showing a position of a transistor produced as the electronic device in FIGS. 12A to 12E.
Figure 12E:
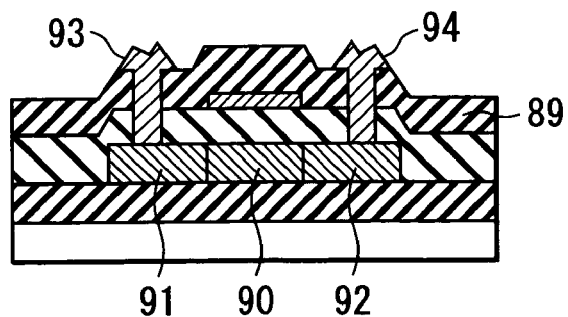

Next, as shown in FIG. 12E, an interlayer insulating film 89 is formed, contact holes are made, and a source electrode 93 and drain electrode 94 connected to a source 91 and drain 92 are formed. The source is connected to the drain via a channel 90. At this time, the channel 90 is located within the crystal grain of the large diameter formed in the polycrystalline or single-crystal semiconductor film 84 through the steps shown in FIGS. 12A and 12B. With the above-described steps, a polycrystalline or single-crystal semiconductor transistor positioned as shown in FIG. 13 can be obtained. This polycrystalline or single-crystal semiconductor transistor can be applied to driving circuits for a liquid crystal display or electro luminescence (EL) display, integrated circuits such as a memory (SRAM or DRAM) and CPU, and the like.

An example in which the transistor obtained as described above is actually applied to an active matrix liquid crystal display will be described hereinafter.

Figure 14:
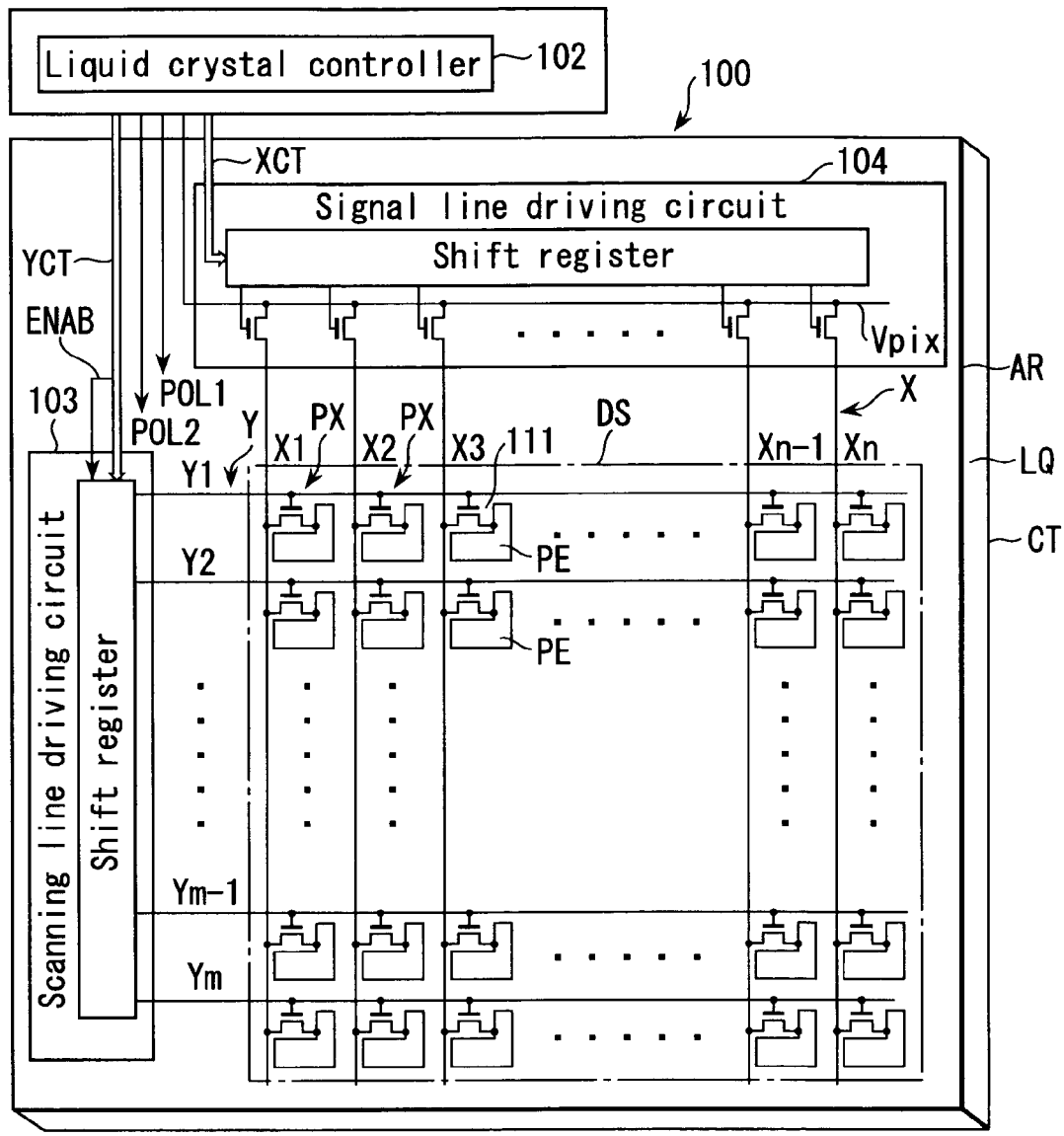
FIG. 14 is a diagram schematically showing the circuit configuration of a liquid crystal display containing the transistor shown in FIG. 13.
Figure 15:
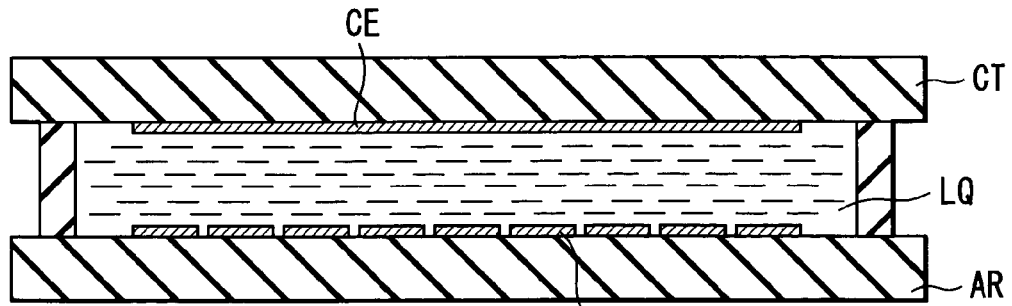
FIG. 15 is a diagram schematically showing a sectional structure of the liquid crystal display shown in FIG. 14.

FIG. 14 is a diagram schematically showing the circuit configuration of the liquid crystal display. FIG. 15 is a diagram schematically showing a sectional structure of the liquid crystal display.

The liquid crystal display includes a liquid crystal display panel 100 and a liquid crystal controller 102 for controlling the liquid crystal display panel 100. The liquid crystal display panel 100 has a structure in which, for example, a liquid crystal layer LQ is held between an array substrate AR and a counter substrate CT. The liquid crystal controller 102 is disposed on a driving circuit substrate disposed separately from the liquid crystal display panel 100.

The array substrate AR includes a plurality of pixel electrodes PE arrayed in a matrix form within a display region DS on a glass substrate, a plurality of scanning lines Y (Y1 to Ym) formed along rows of the pixel electrodes PE, a plurality of signal lines X (X1 to Xn) formed along columns of the pixel electrodes PE, pixel switching elements 111 which are disposed near intersections of the signal lines X1 to Xn and the scanning lines Y1 to Ym and each of which captures a video signal Vpix from a corresponding signal line X in response to a scanning signal from a corresponding scanning line Y to supply the signal to a corresponding pixel electrode PE, a scanning line driving circuit 103 for driving the scanning lines Y1 to Ym, and a signal line driving circuit 104 for driving the signal lines X1 to Xn. Each pixel switching element 111 is formed, for example, of an N-channel thin film transistor formed as described above. The scanning line driving circuit 103 and signal line driving circuit 104 are integrated on the array substrate AR by thin film transistors formed along with the thin film transistors of the pixel switching elements 111 in the same manner as that of each embodiment described above. The counter substrate CT includes a single counter electrode CE disposed to face the pixel electrodes PE and set to a common potential Vcom, a color filter (not shown), and the like.

The liquid crystal controller 102 receives a video signal and synchronous signal supplied externally, for example, to generate a video signal Vpix for pixels, vertical scanning control signal YCT, and horizontal scanning control signal XCT. The vertical scanning control signal YCT includes, for example, a vertical start pulse, vertical clock signal, output enable signal ENAB, and the like, and is supplied to the scanning line driving circuit 103. The horizontal scanning control signal XCT includes a horizontal start pulse, horizontal clock signal, polarity reverse signal, and the like, and is supplied to the signal line driving circuit 104 together with the pixel video signal Vpix.

The scanning line driving circuit 103 includes a shift register, and is controlled by the vertical scanning control signal YCT so as to sequentially supply a scanning signal for energizing the pixel switching device 111 to the scanning lines Y1 to Ym every vertical scanning (frame) period. The shift register shifts the vertical start pulse supplied every vertical scanning period in synchronization with the vertical clock signal to select one of the scanning lines Y1 to Ym, and refers to the output enable signal ENAB to output the scanning signal to the selected scanning line. The output enable signal ENAB is maintained at a high level so as to permit the output of the scanning signal in an effective scanning period in the vertical scanning (frame) period. The signal is maintained at a low level so as to prohibit the output of the scanning signal in a vertical blanking period obtained by excluding the effective scanning period from the vertical scanning period.

The signal line driving circuit 104 includes a shift register and sample output circuit, and is controlled by the horizontal scanning control signal XCT to serial-parallel convert or sample the video signal Vpix input in each horizontal scanning period (1H) during which one scanning line Y is driven by the scanning signal, and supply analog pixel display signals obtained by sampling to the signal lines X1 to Xn.

In this liquid crystal display, the thin film transistors of the scanning line driving circuit 103 and signal line driving circuit 104 can be formed in a process common to the thin film transistors of the pixel switching elements 111.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A crystallization apparatus comprising:
   an illumination system which applies illumination light for crystallization to a non-single-crystal semiconductor film;
   a phase shifter which includes first and second regions disposed to form a straight boundary and transmitting the illumination light from said illumination system by a first phase retardation therebetween, and phase-modulates the illumination light to provide a light intensity distribution having an inverse peak pattern that light intensity falls in a zone of said non-single-crystal semiconductor film containing an axis corresponding to said boundary; said phase shifter further including a small region which extends into at least one of said first and second regions from said boundary and transmits the illumination light from the illumination system by a second phase retardation with respect to said at least one of said first and second regions.

2. The crystallization apparatus according to claim 1, wherein said small region has a first small sector which is formed in said first region and transmits the illumination light by the second phase retardation with respect to said first region, and a second small sector which is formed in said second region and transmits the illumination light by the second phase retardation with respect to said second region.

3. The crystallization apparatus according to claim 1, wherein the first phase retardation is about 180 degrees.

4. The crystallization apparatus according to claim 1, wherein said small region has a shape symmetrical with respect to said boundary.

5. The crystallization apparatus according to claim 1, wherein said phase shifter is disposed in parallel with and in the proximity of said non-single-crystal semiconductor film.

6. The crystallization apparatus according to claim 5, wherein the second phase retardation is about 60 degrees.

7. The crystallization apparatus according to claim 6, wherein said small region has a size a in a lateral direction perpendicular to said boundary within said at least one of said first and second regions, and said size a satisfies a condition $a \geq d \cdot \tan \theta$ which depends on a maximum incidence angle $\theta$ of the illumination light incident upon said phase shifter and a distance d between said non-single-crystal semiconductor film and said phase shifter.

8. The crystallization apparatus according to claim 1, further comprising an optical imaging system disposed between said non-single-crystal semiconductor film and said phase shifter to locate said non-single-crystal semiconductor film and phase shifter at positions conjugated with each other, and the numerical aperture of said optical imaging system on an imaging side being set a preset value required for the light intensity distribution having said inverse peak pattern.

9. The crystallization apparatus according to claim 8, wherein the second phase retardation is about 180 degrees.

10. The crystallization apparatus according to claim 8, wherein said lateral size a satisfies a condition $a \leq \lambda/NA$ depending on the imaging-side numerical aperture NA of said optical imaging system and a wavelength $\lambda$ of the illumination light.

11. The crystallization apparatus according to claim 5, wherein said small region has a size a in a lateral direction perpendicular to said boundary within said at least one of said first and second regions, and said size a satisfies a condition $a \geq d \cdot \tan \theta$ which depends on a maximum incidence angle $\theta$ of the illumination light incident upon said phase shifter and a distance d between said non-single-crystal semiconductor film and said phase shifter.

* * * * *